(12) United States Patent
Harashima et al.

(10) Patent No.: US 11,390,944 B2
(45) Date of Patent: Jul. 19, 2022

(54) FILM-FORMING DEVICE AND METHOD FOR CLEANING SAME

(71) Applicant: TOKYO ELECTRON LIMITED, Tokyo (JP)

(72) Inventors: Masayuki Harashima, Nirasaki (JP); Yukio Sano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 180 days.

(21) Appl. No.: 16/604,391

(22) PCT Filed: Dec. 20, 2017

(86) PCT No.: PCT/JP2017/045681
§ 371 (c)(1),
(2) Date: Oct. 10, 2019

(87) PCT Pub. No.: WO2018/193664
PCT Pub. Date: Oct. 25, 2018

(65) Prior Publication Data
US 2020/0157677 A1 May 21, 2020

(30) Foreign Application Priority Data

Apr. 18, 2017 (JP) .............................. JP2017-081840

(51) Int. Cl.
*C23C 16/44* (2006.01)
*C23C 16/458* (2006.01)
(Continued)

(52) U.S. Cl.
CPC ............ *C23C 16/4405* (2013.01); *B08B 5/00* (2013.01); *B08B 7/0071* (2013.01);
(Continued)

(58) Field of Classification Search
None
See application file for complete search history.

(56) References Cited

FOREIGN PATENT DOCUMENTS

JP     H3-48268 B2    7/1991
JP     5-331630 A    12/1993
(Continued)

OTHER PUBLICATIONS

JP2007243014 English Translation, accessed on May 2021. (Year: 2007).*

*Primary Examiner* — Eric W Golightly
*Assistant Examiner* — Arlyn I Rivera-Cordero
(74) *Attorney, Agent, or Firm* — Nath, Goldberg & Meyer; Jerald L. Meyer; Tanya E. Harkins

(57) ABSTRACT

A cleaning method of cleaning a film-forming device, which includes a processing container having a substrate holder provided in the processing container so as to hold a SiC substrate, and which supplies a source gas to the processing container, an interior of which is depressurized, and heats the SiC substrate so as to perform a film formation on the SiC substrate, includes: a reaction product removal process of removing a reaction product, which is formed during the film formation and attached to portions other than the SiC substrate, by supplying a $ClF_3$ gas into the processing container after the film formation; and a residue removal process of removing a substance, which remains after the reaction product removal process and serves as an unnecessary impurity or causes a defect during a subsequent film formation, by supplying air into the processing container.

5 Claims, 9 Drawing Sheets

(51) Int. Cl.
    *C23C 16/46*     (2006.01)
    *H01L 21/687*    (2006.01)
    *B08B 5/00*      (2006.01)
    *B08B 7/00*      (2006.01)
(52) U.S. Cl.
    CPC .......... *C23C 16/4583* (2013.01); *C23C 16/46* (2013.01); *H01L 21/68757* (2013.01)

(56) References Cited

FOREIGN PATENT DOCUMENTS

| | | | | |
|---|---|---|---|---|
| JP | 2007-243014 A | | 9/2007 | |
| JP | 2007243014 | * | 9/2007 | ............. C23C 16/44 |
| JP | 2015-40153 A | | 3/2015 | |

* cited by examiner

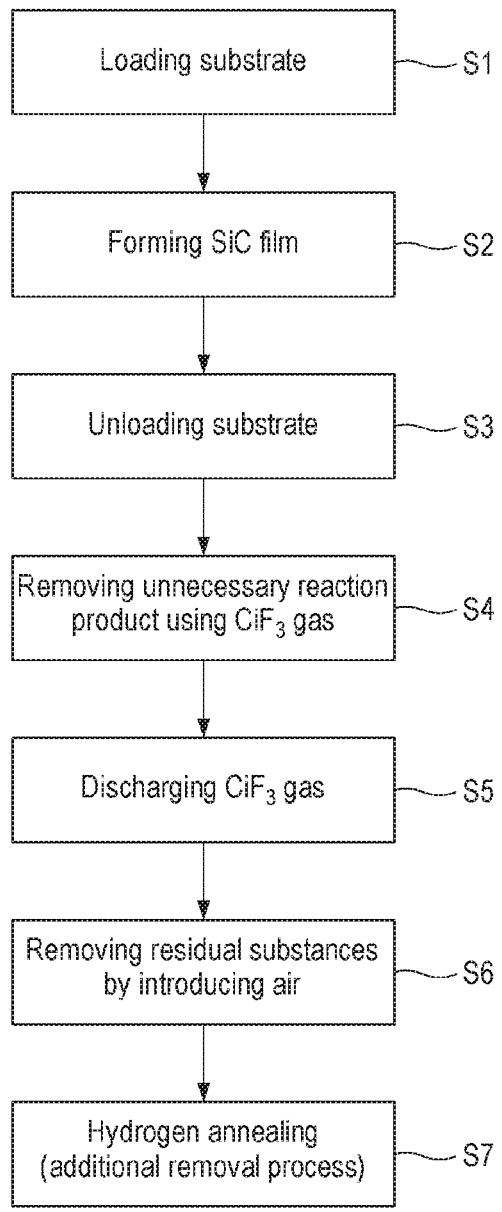

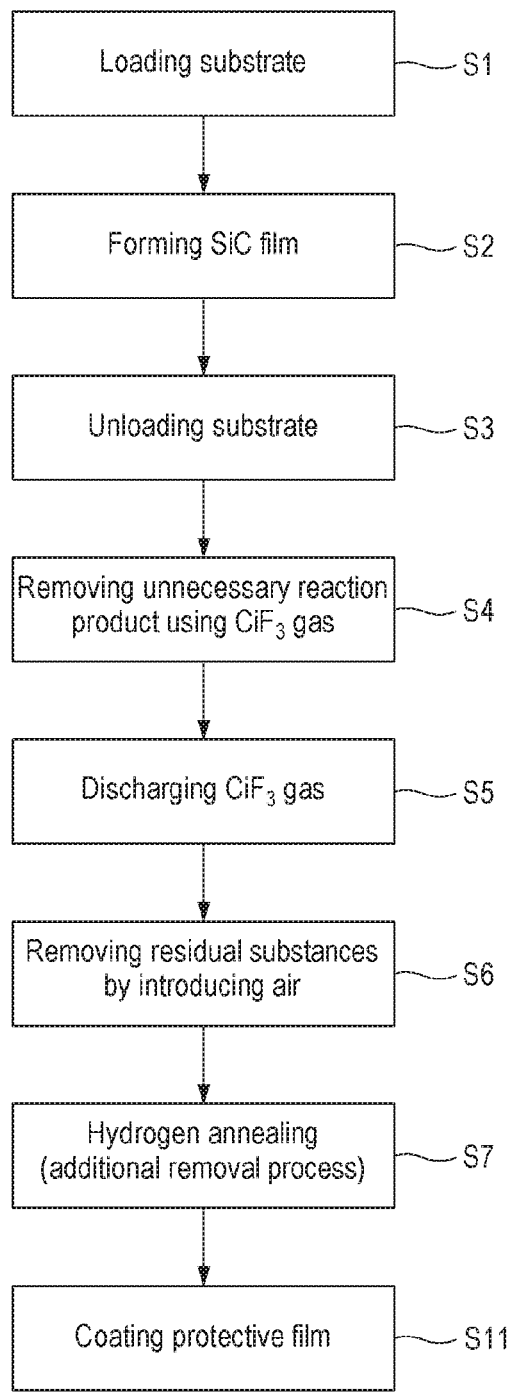

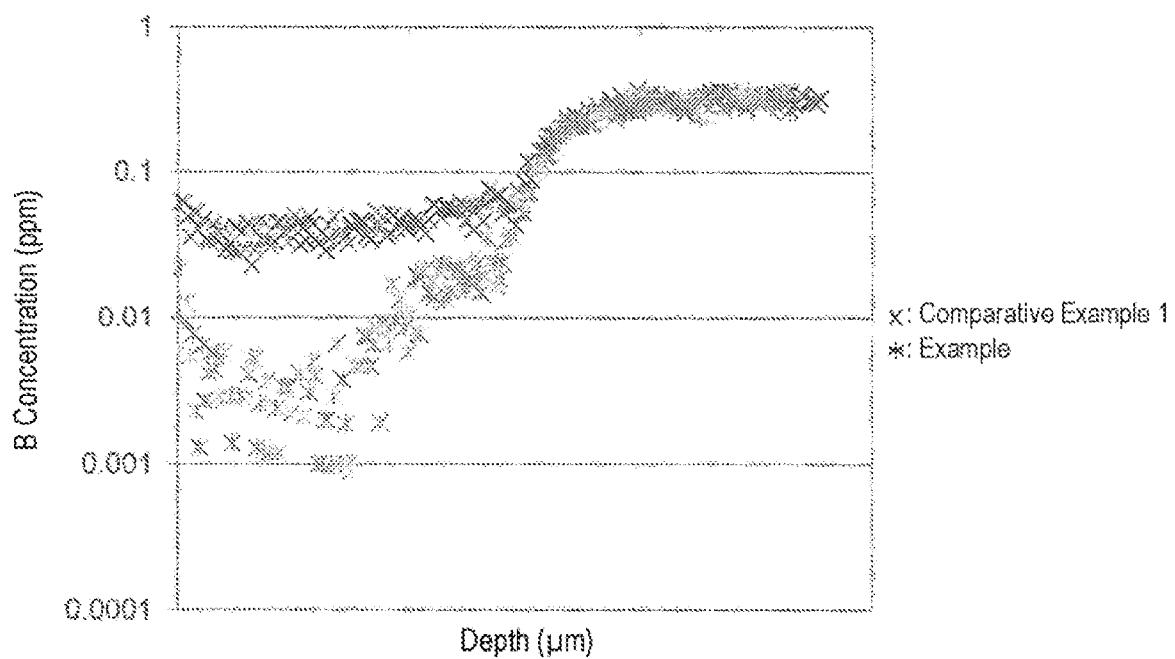

FILM-FORMING DEVICE AND METHOD FOR CLEANING SAME

CROSS-REFERENCE TO RELATED APPLICATION

This is a National Phase Application under 35 U.S.C. 371 as a national stage of PCT/JP2017/045681, filed Dec. 20, 2017, an application claiming the benefit of priority from Japanese Patent Application No. 2017-81840, filed on Apr. 18, 2017, the entire contents of which are incorporated herein by reference.

TECHNICAL FIELD

The present disclosure relates to a film-forming apparatus and a method of cleaning the same.

BACKGROUND

In recent years, silicon carbide (SiC) has been used for electronic devices such as semiconductor power devices. In a manufacturing process of such electronic devices, a SiC film is formed on a SiC substrate through epitaxial growth, which grows, on a single crystalline substrate, a film having the same orientation as the crystal of the substrate.

A known film-forming device for forming a SiC film through epitaxial growth includes a substrate holder that holds a substrate to be processed and is heated, and a processing container that accommodates the substrate holder. In this film-forming device, an insulation material is provided between the substrate holder and the processing container, and an exhaust device is connected to the processing container via an exhaust pipe such as an exhaust manifold. During film formation, the processing container is brought into a depressurized atmosphere by the exhaust device.

In the SiC film-forming device described above, unnecessary reaction products are attached to portions other than the substrate to be processed, such as the substrate holder, the exhaust pipe, and the insulation material. When the reaction products are attached as described above, stress may be applied to the substrate holder. In addition, the unnecessary reaction products may grow in the form of a tree in the vicinity of an opening serving as a substrate loading/unloading port and a gas introduction port, and may come into contact with the substrate to be processed during an automatic transfer of the substrate to be processed. Therefore, in order to remove the unnecessarily attached reaction products, that is, for the purpose of cleaning the film-forming device, conventionally, a method of periodically wiping and polishing or a method of supplying hydrogen while heating the substrate holder has been adopted.

Patent Document 1 discloses a method of cleaning a film-forming device, in which, after a thin film of a metal substance such as amorphous SiC is formed through a chemical vapor deposition (CVD) method, a CVD furnace is cleaned using a fluorine-based gas such as chlorine trifluoride ($ClF_3$), and substances remaining in the furnace after the cleaning process are removed by causing a hydrogen ($H_2$) gas to flow.

PRIOR ART DOCUMENT

Patent Document

Patent Document 1: Japanese laid-open publication No. H3-48268

SUMMARY

The unnecessary reaction products attached during film formation in a SiC film-forming device include unstable and easily burned deposits such as silane ($SiH_x$). Thus, when the reaction products are regularly removed by wiping or polishing as described above, it is necessary to sufficiently consider safety and thus workability is poor. Furthermore, in the method of performing wiping or the like, a device downtime becomes longer because a work time including a time for cooling the processing container is long.

Meanwhile, when hydrogen is supplied to unnecessary reaction products while heating the substrate holder as described above, it is impossible to sufficiently remove both of silicon and 3C-SiC.

According to a study of the present inventors, even when the unnecessary reaction products attached during the film formation in the SiC film-forming device are removed, as in Patent Document 1, by supplying a $ClF_3$ gas to the processing container after the film formation and by removing the substances remaining in the processing container by causing a $H_2$ gas to flow in the processing container after the supply of the $ClF_3$ gas, in some cases, many defects may occur in the SiC film formed after such removal.

The present disclosure has been made in view of the above circumstances, and provides a film-forming device, which can be effectively cleaned in a short time, and in which few impurities and defects exist in a film formed after the cleaning process, and a method of cleaning the device.

An aspect of the present disclosure for solving the above problems provides a cleaning method of cleaning a film-forming device, which includes a processing container having a substrate holder provided in the processing container so as to hold a substrate to be processed, and which supplies a source gas to the processing container, an interior of which is depressurized, and heats the substrate to be processed so as to perform a film formation on the substrate to be processed. The cleaning method includes: a reaction product removal process of removing a reaction product, which is formed during the film formation and attached to portions other than the substrate to be processed, by supplying a fluorine-based cleaning gas into the processing container after the film formation; and a residue removal process of removing a substance, which remains after the reaction product removal process and serves as an unnecessary impurity or causes a defect during a subsequent film formation, by supplying air into the processing container.

An aspect of the present disclosure according to another viewpoint provides a film-forming device, which includes a processing container having a substrate holder provided in the processing container so as to hold a substrate to be processed, and which supplies a source gas to the processing container to which an exhaust line is connected and heats the substrate to be processed so as to perform a film formation on the substrate to be processed. The film-forming device includes: a fluorine-based cleaning gas supply line configured to supply a fluorine-based cleaning gas into the processing container; an air introduction line configured to introduce air into the processing container; and a controller configured to perform a control on the exhaust line to: remove a reaction product, which is formed during the film formation and attached to portions other than the substrate to be processed, by supplying the fluorine-based cleaning gas into the processing container after the film formation; and remove a substance, which remains and serves as an unnecessary impurity and causes a defect during a subsequent film formation, by supplying the air into the processing container.

According to the present disclosure, it is possible to effectively perform a cleaning process in a short time, and to reduce impurities and defects in a film formed after the cleaning process.

BRIEF DESCRIPTION OF DRAWINGS

FIG. 5 is a view illustrating a flowchart for explaining a substrate processing according to a first embodiment of the present disclosure.

FIG. 6 is a view illustrating a flowchart for explaining a substrate processing according to a second embodiment of the present disclosure.

FIG. 7 is a view illustrating impurity concentration distributions in the depth direction in Example and Comparative Example 1.

DETAILED DESCRIPTION

Figure 1:
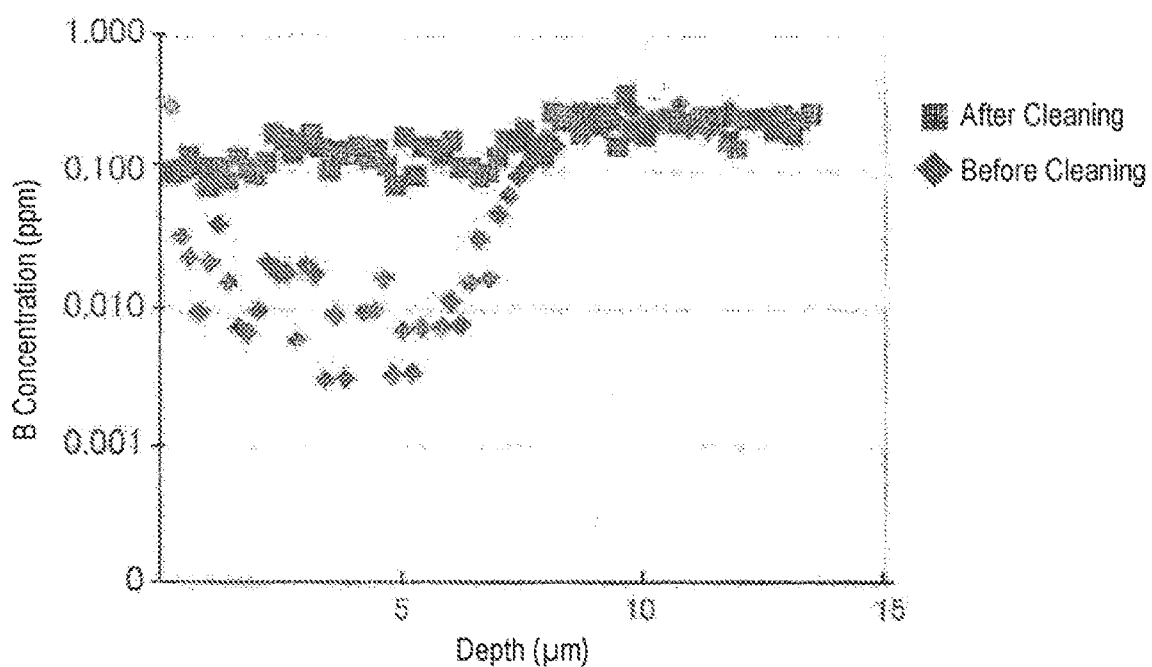
FIG. 1 is a view illustrating impurity concentration distributions in a depth direction of a SiC epitaxial film formed before and after a cleaning process that performs a removal process using $ClF_3$ gas only.

When removing unnecessary reaction products attached during film formation in a SiC film-forming device using epitaxial growth, there are problems described above in the conventional methods of regularly wiping and polishing or supplying a hydrogen gas while heating a substrate holder. Therefore, the inventors examined removing unnecessary reaction products by supplying a $ClF_3$ gas after the film formation in a SiC film-forming device. As a result of the examination, when removing the reaction products using the $ClF_3$ gas, it was confirmed that, by setting a temperature of a substrate holder (see reference numeral 15 in FIG. 4) to be at least higher than room temperature (e.g., 500 degrees C.), 3C-SiC formed on the substrate holder, $SiH_X$ deposits formed on an inner wall of an exhaust pipe (see reference numeral 12a in FIG. 3), and silicon (Si) deposits formed on a gas introduction port into the substrate holder are removed.

However, when performing a cleaning process by removing unnecessary reaction products simply by using the $ClF_3$ gas, it has been found that, when a film is formed after the removal, (1) unnecessary impurities are included in the SiC film, and (2) many triangular defects are generated in the SiC film, which will be described below.

FIG. 1 is a view illustrating impurity concentration distributions in a depth direction in a SiC film formed through epitaxial growth before a cleaning process using a $ClF_3$ gas and in a SiC film formed after the cleaning process, wherein impurity concentration distributions of boron (B) are illustrated. In FIG. 1, the horizontal axis represents the depth from the substrate surface, and the vertical axis represents the concentration. A thicknesses of formed SiC films were 7 μm.

As illustrated in FIG. 1, after the cleaning process using the $ClF_3$ gas, the boron concentration in the formed SiC film becomes about 10 times that before the cleaning process. Boron serves as a P-type dopant in the SiC epitaxial growth film.

Figure 2A:
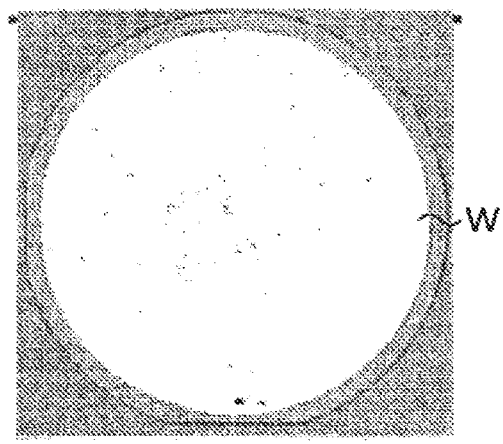
FIGS. 2A and 2B are views illustrating defect maps on a surface of a SiC epitaxial film formed before and after a cleaning process that performs a removal process using $ClF_3$ gas only.
Figure 2B:
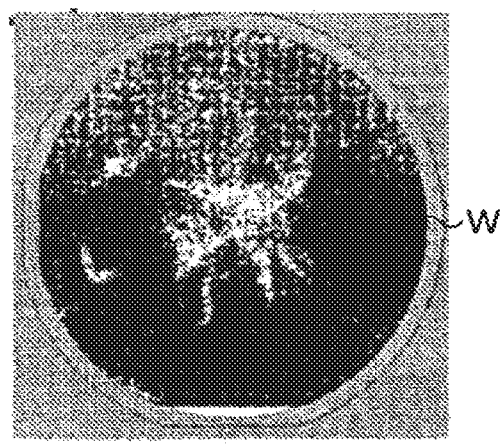

FIGS. 2A and 2B are views illustrating defect maps on surfaces of SiC films formed through epitaxial growth, wherein FIG. 2A is a defect map of the surface of a SiC film formed before a cleaning process using the $ClF_3$ gas and FIG. 2B is a defect map of a SiC film formed after the cleaning process. A defect maps is obtained by indicating black marks at locations in a substrate where defects exist.

As illustrated in FIGS. 2A and 2B, there are a large number of defects on the surface of the SiC film formed after the cleaning process.

Therefore, the inventors examined, as a cleaning process, further performing a hydrogen annealing process after removing unnecessary reaction products using a $ClF_3$ gas.

As a result of the examination, it was found that an amount of unnecessary impurities contained in the SiC film was small when the film was formed after the removal process using the $ClF_3$ gas and the hydrogen annealing process. For example, since it was possible to set a carrier concentration in the SiC film to a desired value by performing a hydrogen annealing process in which a temperature of a susceptor is increased and maintained for a predetermined time while causing a hydrogen gas to flow into a processing chamber, it was possible to reduce the concentration of unnecessary impurities in the SiC film through the hydrogen annealing process.

When a cleaning rate is low (when a flow rate of a $ClF_3$ gas when removing unnecessary reaction products using the $ClF_3$ gas is low), it is possible to reduce defects generated in the SiC film formed after the removal process of the reaction products and the hydrogen annealing process. However, when the cleaning rate is high (for example, four times the rate when the cleaning rate is low), it is impossible to sufficiently reduce the amount of defects.

For example, when the flow rate of the $ClF_3$ gas is as high as 1,000 sccm, the defect map of the SiC film formed after the hydrogen annealing process includes a large number of defects on the surface of the SiC film as in the defect map of FIG. 2B.

The above-mentioned defects occur even when the hydrogen annealing process is performed for a long time, and also occur when a dummy run is performed multiple times instead of the hydrogen annealing process. The dummy run is a film-forming process that is performed preliminarily before a film as a product is formed.

The following embodiments of the present disclosure are based on the above-described examination results.

Hereinafter, the embodiments of the present disclosure will be described with reference to the drawings. In the present specification and drawings, elements having substantially the same functional configuration are denoted by the same reference numerals, and redundant descriptions will be omitted.

Figure 3:
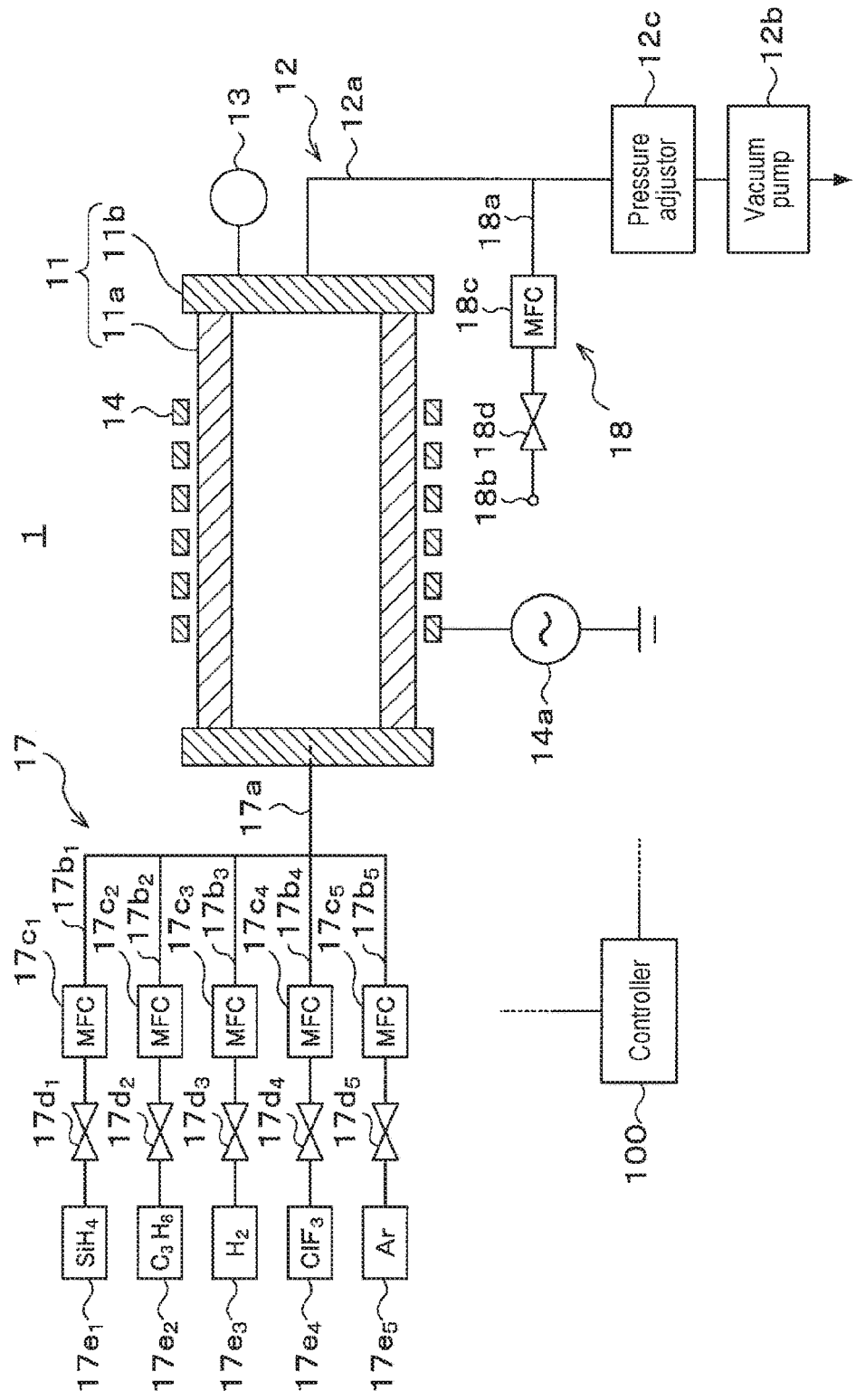
FIG. 3 is a view schematically illustrating an outline of a configuration of a film-forming device to be cleaned by a cleaning method according to an embodiment of the present disclosure.
Figure 4:
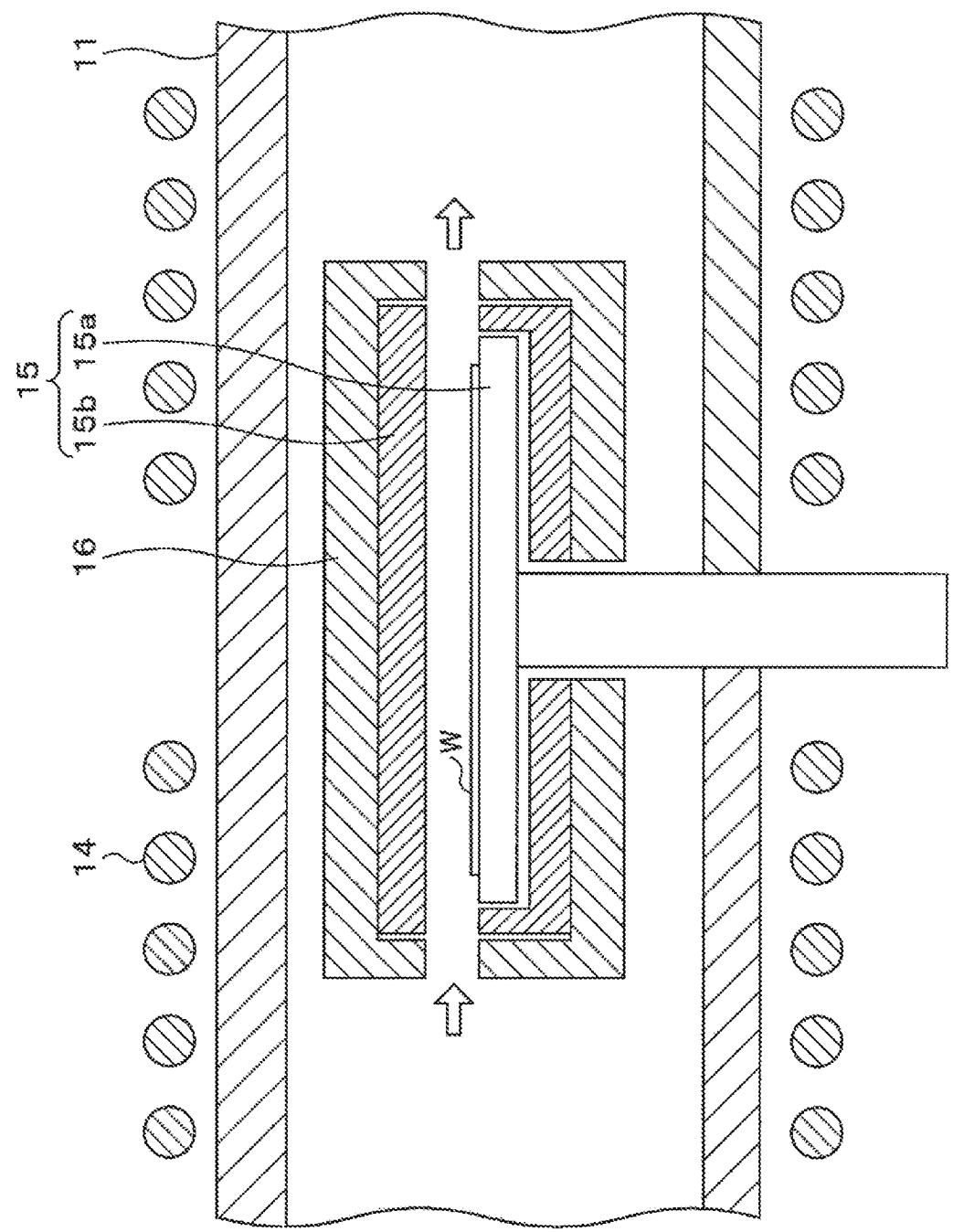
FIG. 4 is a view schematically illustrating an outline of a structure of a processing container of the film-forming device illustrated in FIG. 3.

FIG. 3 is a view schematically illustrating an outline of a configuration of a film-forming device to be cleaned by a cleaning method according to an embodiment of the present disclosure. FIG. 4 is a view schematically illustrating an outline of a structure of a processing container of the film-forming device illustrated in FIG. 3.

A film-forming device 1 illustrated in FIG. 3 includes a processing container 11 having a substantially rectangular parallelepiped shape.

An exhaust line 12 is connected to the processing container 11, and the processing container 11 is configured to be adjustable to a predetermined depressurized state (pressure) by the exhaust line 12. The exhaust line 12 has the exhaust pipe 12a having one end connected to the processing container 11. The exhaust pipe 12a includes an exhaust manifold or the like, and a vacuum pump 12b such as a mechanical booster pump or the like is connected to a side opposite a side of the processing container. Between the processing container 11 and the vacuum pump 12b in the exhaust pipe 12a, a pressure adjustor 12c that adjusts a pressure in the processing container 11 is provided. The pressure adjustor 12c includes an automatic pressure control (APC) valve, a proportional control valve, or the like. In addition, the processing container 11 is provided with a pressure gauge 13, and the pressure in the processing container 11 is adjusted by the pressure adjustor 12c based on a measurement result of the pressure gauge 13.

The processing container 11 includes a hollow rectangular column processing container body 11a having openings at both ends thereof, and side walls 11b connected to the openings. A coil 14 connected to a high-frequency power supply 14a is provided outside the processing container body 11a. The coil 14 inductively heats a substrate to be processed in the processing container 11 and a substrate holder to be described later.

In the processing container 11, as illustrated in FIG. 4, the substrate holder 15 is provided to hold and heat a SiC substrate W as a substrate to be processed. A plane orientation of a surface of the SiC substrate W is, for example, (0001).

The substrate holder 15 includes a stage 15a on which the SiC substrate W (hereinafter, referred to as "substrate W") is placed, and a housing structure 15b that accommodates the stage 15a. The substrate holder 15 is inductively heated by the coil 14.

In the film-forming device 1, the substrate W is heated by radiation or heat conduction from the substrate holder 15 that has been inductively heated, in addition to induction heating of the substrate W itself by the coil 14. With this configuration, it is possible to efficiently heat the substrate W with good temperature uniformity. The processing container body 11a is formed of a material (e.g., quartz) that can withstand a temperature increase and has a small dielectric loss. In addition, the stage 15a and the housing structure 15b of the substrate holder 15 are formed of a conductive material that has a high heat resistance and can be easily heated by induction heating, for example, a graphite member having a surface coated with a SiC film as a protective film.

The housing structure 15b of the substrate holder 15 is formed in a rectangular parallelepiped shape having openings formed in two surfaces facing each other, and is configured such that a film-forming source gas is supplied from the opening formed in one surface and is discharged from the opening formed in the other surface. In this structure, the source gas supplied to the substrate W is supplied and discharged in a direction parallel to the substrate W.

Further, an insulation material 16 for insulating the substrate holder 15, that is, for insulating the substrate W and the processing container 11 from each other, is provided on an outer periphery of the substrate holder 15.

The substrate holder 15 is formed using, for example, a carbon material that is so dense as to be referred to as a so-called bulk material, and the insulation material 16 is formed using, for example, a fibrous carbon material that has a significantly higher porosity than the bulk material.

In addition, although illustration is omitted, a holding structure configured to hold the insulation material 16 in a state where the insulation material 16 is spaced apart from the processing container 11 is provided outside the insulation material 16.

Descriptions will be made referring back to FIG. 3.

The processing container 11 is configured to be supplied with a source gas or the like as a film-forming source through a gas supply line 17. The gas supply line 17 includes a gas supply pipe 17a connected to the processing container 11, and gas supply pipes $17b_1$ to $17b_5$ connected to the gas supply pipe 17a.

The gas supply pipes $17b_1$ to $17b_5$ are provided with mass flow controllers (MFC) $17c_1$ to $17c_5$ and valves $17d_1$ to $17d_5$, respectively.

The gas supply source $17e_1$ is connected to the gas supply pipe $17b_1$, and a $SiH_4$ gas is supplied from the gas supply source $17e_1$. Similarly, gas supply sources $17e_2$ to $17e_5$ are connected to the gas supply pipes $17b_2$ to $17b_5$, respectively, and a $C_3H_8$ gas, a $H_2$ gas, a $ClF_3$ gas, and an Ar gas are supplied from the gas supply sources $17e_2$ to $17e_5$, respectively.

When a SiC film is formed on the substrate W through epitaxial growth, the $SiH_4$ gas, the $C_3H_8$ gas, and the $H_2$ gas are supplied to the processing container 11 as film-forming source gases from the gas supply pipes $17b_1$ to $17b_3$, respectively.

In addition, when the processing container 11 is cleaned, from the gas supply pipes $17b_3$ to $17b_5$, one of the $ClF_3$ gas, the $H_2$ gas, and the Ar gas is supplied to the processing container 11. Alternatively, two or more of these gases are mixed and supplied to the processing container 11.

Furthermore, in the film-forming device 1, an air introduction line 18 is connected to an upstream of the pressure adjustor 12c in the exhaust pipe 12a so as to introduce air into the processing container 11 when the processing container 11 is cleaned. The air introduction line 18 has a pipe 18a having one end connected to the exhaust pipe 12a and the other end at which an air introduction port 18b is formed. The pipe 18a is provided with a mass flow controller (MFC) 18c and a valve 18d in this order from a side of the exhaust pipe 12a.

A connection location of the air introduction line 18 is not limited to the exhaust pipe 12a as long as it is possible to make the interior of the processing container 11 have atmospheric atmosphere. The pipe 18a is preferably provided with a filter (not illustrated) so as to remove particles, dusts, and the like from the air.

The film-forming device 1 further includes a controller 100. The controller 100 is, for example, a computer, and has a program storage (not illustrated). The program storage stores a program for controlling the respective devices such as the valves, the MFCs, the high-frequency power supply, and the pressure adjustor so as to perform a film-forming process and a cleaning process of the film-forming device 1.

The program may be stored in a computer-readable storage medium such as a computer-readable hard disk (HD), a flexible disk (FD), a compact disk (CD), a magnet optical disk (MO), or a memory card, and may be installed to the controller 100 from the storage medium.

First Embodiment

Next, a substrate processing using the film-forming device 1 including a film-forming process and a cleaning process of the film-forming device 1 will be described. FIG. 5 is a flowchart for explaining an example of the substrate processing according to a first embodiment.

First, by using a transfer mechanism (not illustrated), the substrate W is loaded into the processing container 11 through a gate valve (not illustrated) and placed on the stage 15a (step S1).

Next, a source gas is supplied into the processing container 11 and the substrate W is inductively heated so as to form a SiC film on the substrate W through epitaxial growth (step S2). Specifically, the valves $17d_1$ to $17d_3$ are opened, and flow rates are adjusted by the MFCs $17c_1$ to $17c_3$ to supply the $SiH_4$ gas, the $C_3H_8$ gas, and the $H_2$ gas into the processing container 11. In addition, the substrate W is heated by applying a high-frequency power to the coil 14 from the high-frequency power supply 14a. During the film formation, a pressure in the processing container 11 is set to be, for example, 10 Torr to 600 Torr, the flow rates of the $SiH_4$ gas, the $C_3H_8$ gas, and the $H_2$ gas are set to be, for example, 10 to 600 sccm, 10 to 600 sccm, and 10 to 200 slm, respectively, and the temperature of the substrate W is set to be, for example, 1,500 degrees C. to 1,700 degrees C. In addition, when the SiC film is formed as an n-type, a $N_2$ gas may be added to the source gas, and when the SiC film is formed as a p-type, trimethylaluminum (TMA) may be added to the source gas.

After the film formation is completed, the valves $17d_1$ to $17d_3$ are closed, the supply of the source gas is stopped, and then the substrate W is unloaded from the processing container 11 through the gate valve (not illustrated) (step S3). The supply of the high-frequency power to the coil 14 may be interrupted during the unloading process of the substrate W. However, it is preferable to supply the high-frequency power to the coil 14 while controlling the supply of the high-frequency power such that the temperature of the substrate holder 15 is set to be an optimal temperature for a subsequent process.

After unloading the substrate W, the $ClF_3$ gas is supplied into the processing container 11 to remove unnecessary reaction products attached to portions other than the substrate W during the film formation (step S4). Specifically, the valves $17d_4$ and $17d_5$ are opened, and flow rates are adjusted by the MFCs $17c_4$ and $17c_5$ to supply the $ClF_3$ gas and the Ar gas for dilution into the processing container 11. When supplying the $ClF_3$ gas, it is preferable to apply a high-frequency power from the high-frequency power supply 14a to the coil 14 to heat the substrate holder 15. During the removal process of the reaction products, the pressure in the processing container 11 is set to be, for example, 10 Torr to 100 Torr, the flow rate of the $ClF_3$ gas is set to be, for example, 100 to 2,000 sccm, and the temperature of the substrate holder 15 is set to be, for example, 400 degrees C. to 600 degrees C. The temperature of the substrate holder 15 is preferably set to be 400 degrees C. or higher in order to increase the etching rate of the reaction product (SiC) attached to the substrate holder 15. By increasing the temperature of the substrate holder 15, the temperature of surrounding members such as the processing container 11 is also increased, and the surrounding members may be etched by the $ClF_3$ gas. Thus, the temperature of the substrate holder 15 is preferably set to be 600 degrees C. or lower.

After the reaction product removal process, the $ClF_3$ gas is discharged from the processing container 11 (step S5). Specifically, the valve $17d_4$ is closed in the state in which the valve $117d_5$ is opened, and the flow rate is adjusted by the MFC $17c_5$ to supply the Ar gas into the processing container 11, whereby the $ClF_3$ gas in the processing container 11 is discharged.

After the $ClF_3$ gas is discharged, air is introduced into the processing container 11, and thereby, substances remaining after the cleaning process using the $ClF_3$ gas, that is, substances which are unnecessary impurities and cause defects in a subsequent film formation, is removed (step S6). Specifically, the valve $17d_5$ is closed and the valve $18_d$ is opened, and the flow rate is adjusted by the MFC 18c to introduce the air into the processing container 11 such that the remaining substances are removed. During the introduction of the air, the pressure in the processing container 11 is controlled to be, for example, 10 kPa to 65 kPa, and the introduction of the air is performed for 0.5 to 2.0 hours. In addition, when the air is introduced at a high temperature exceeding 350 degrees C., damage due to oxidization may occur in the substrate holder 15 and the like. Therefore, it is preferable to perform the introduction of the air for 0.5 to 2.0 hours from the time at which the temperature is set to be 350 degrees C. or lower.

After the removal of the residual substances after the cleaning process, the $H_2$ gas is supplied into the processing container 11 and a hydrogen annealing process is performed (step S7). Specifically, the valve 18d is closed and the valve $17d_3$ is opened, and the flow rate is adjusted by the MFC $17c_3$ to supply the $H_2$ gas into the processing container 11. During the hydrogen annealing process, a high-frequency power is applied to the coil 14 from the high-frequency power supply 14a to heat the substrate holder 15. By the hydrogen annealing process, substances that were not removed in the reaction product removal process and the residual substance removal process are removed. During the hydrogen annealing process, the flow rate of the $H_2$ gas is set to be, for example, 10 to 200 slm, and the temperature of the substrate holder 15 is set to be, for example, 1,500 degrees C. or higher.

After the hydrogen annealing process, control is returned to step S1. Thus, another SiC substrate is loaded into the processing container 11, and the processes of steps S1 to S7 are repeated. The series of cleaning processes in steps S4 to S7 may be performed every time a film is formed on each of a plurality of SiC substrates.

As described above, in the cleaning method of the present embodiment, the ClF3 gas is supplied to the processing container 11 after the film formation. Thus, it is possible to remove a variety of unnecessary reaction products in the film-forming device 1. In particular, when removing the reaction products, it is possible to simultaneously remove deposits having different properties through a single process as follows. Since only the substrate holder 15 is selectively heated by induction heating, hard 3C-SiC polycrystals grown on the stage 15a of the substrate holder 15 are removed at a high temperature, and deposits that easily react with the $ClF_3$ gas, such as Si and Si-rich dendritic products attached to the vicinity of the gas introduction port of the housing structure 15b of the substrate holder 15 and $SiH_X$ attached to the exhaust pipe 12a, are removed at a low temperature.

In addition, in the removal process using the $ClF_3$ gas, there is no significant deterioration in the insulation material 16, the processing container 11, and the like. This is because it is possible to selectively heat only the substrate holder 15 by induction heating in the film-forming device 1.

In addition, it is presumed that SiC, Si, and $SiH_X$ react with the $ClF_3$ gas according to the following reaction formulas and are removed.

$$3SiC + 8ClF_3 \rightarrow 3SiF_4 + 3CF_4 + 4Cl_2$$

$$3Si + 4ClF_3 \rightarrow 3SiF_4 + 2Cl_2$$

$$3SiH_x + 4ClF_3 \rightarrow 3SiF_4 + 4HCl + nH_2$$

In addition, in the cleaning method of the present embodiment, the air is introduced into the processing container 11 after the reaction product removal process using the $ClF_3$ gas, whereby it is possible to remove substances remaining after the reaction product removal process. As will be described later, it is considered that the substances react with moisture in the air, and is discharged from the processing container 11.

Since it is possible to remove the substances in this manner, it is possible to greatly reduce the amount of unnecessary impurities and defects in the SiC film formed after a series of the cleaning processes.

In the above description, the hydrogen annealing process is performed after the residual substance removal process by introducing the air, but may be performed before the residual substance removal process. By performing the hydrogen annealing process, it is possible to remove substances that are generated in the reaction product removal process using the $ClF_3$ gas and are not removed in the remaining substance removal process through introduction of the air.

According to the study by the present inventors, for example, the surface of 3C-SiC on the stage 15a may be changed by the $ClF_3$ gas, and the surface may become a carbon-rich layer. In addition, the existence of particles in a film-forming atmosphere and a growth under a high C/Si condition are known as the cause of triangular defects, and there is a possibility that carbon powder from the carbon-rich layer becomes particles that cause triangular defects, and that a CH-based gas generated by etching the carbon-rich layer promotes a carbon-rich growth atmosphere.

By performing the hydrogen annealing process, it is possible to remove carbon-reached 3C-SiC.

Accordingly, it is possible to further reduce the amount of unnecessary impurities and defects in the SiC film formed after a series of the cleaning processes.

The cleaning method of the present embodiment may include a process of supplying the Ar gas into the processing container 11 to discharge the air in the processing container 11, after removing the residual substances after the reaction product removal process by introducing the air. By performing the above-mentioned process, it is possible to prevent moisture and oxygen in the air from reacting with the hydrogen gas in the hydrogen annealing process, and it is also possible to prevent nitrogen in the air from being introduced as a dopant during the subsequent film formation.

The gas used in the process of discharging the air may be a gas other than the Ar gas as long as it does not contain moisture or oxygen and is not introduced as a dopant during the subsequent film formation.

In addition, the cleaning method of the present embodiment may include a process of supplying the Ar gas into the processing container 11 to discharge the hydrogen gas in the processing container 11 after the hydrogen annealing process.

Second Embodiment

FIG. 6 is a flowchart for explaining an example of the substrate processing according to a second embodiment.

In the first embodiment, after the hydrogen annealing process in step S7, control is returned to step S1. In contrast, in the present embodiment, as illustrated in FIG. 6, after the hydrogen annealing process in step S7, a SiC film as a protective film is formed on the surface of the substrate holder 15. In other words, the surface of the substrate holder 15 is coated with a SiC film (step S11). Specifically, after the hydrogen annealing process in S7 ends (e.g., after a predetermined time has elapsed since the start of supplying the hydrogen gas during the hydrogen annealing process), the valves $17d_1$ and $17d_2$ are opened in a state in which the valve $17d_3$ is kept open, and the flow rates are adjusted by the MFCs $17c_1$ and $17c_2$ to supply the $SiH_4$ gas and the $C_3H_8$ gas into the processing container 11. Thus, a SiC film of, for example, about 10 µm, is formed on the surface of the substrate holder 15 facing the substrate W, after the processes of step S1 to step S7 are performed.

After the coating process of the SiC film, control is returned to step S1. Thus, another SiC substrate is loaded into the processing container 11, and the processes of steps S1 to S7 and step 11 are repeated. In this example, the hydrogen annealing process and the SiC film coating process are performed after the residual substance removal process by introducing the air, but may be performed before the residual substance removal process.

As described above, the substrate holder 15 is constituted with a graphite member having a surface coated with a SiC film. However, in some cases, the SiC film on the surface of the substrate holder 15 may be removed in the removal process using the $ClF_3$ gas in step S5 so as to expose graphite. In the present embodiment, since the surface of the substrate holder 15 is coated with a SiC film in step S11 after the removal process using the $ClF_3$ gas in step S5, graphite is not exposed from the substrate holder 15 during the film formation after the cleaning process. Accordingly, during the film formation after the cleaning process, it is possible to prevent the occurrence of defects caused by graphite particles of the substrate holder 15 or the occurrence of an abnormality in the impurity concentration caused by scattering of carbon atoms.

In addition, it is possible to expand the lifetime of the substrate holder 15 by coating the substrate holder 15 with the SiC film of about 10 µm for each cleaning process as in the present embodiment.

Furthermore, since the SiC film coating process follows the hydrogen annealing process in the present embodiment, it is not necessary to increase the temperature of the substrate holder 15. Therefore, it is possible to shorten the time required for the cleaning process including the coating process.

In the SiC film coating process, the pressure in the processing container 11 is set to be, for example, 10 Torr to 600 Torr, the flow rates of the $SiH_4$ gas, the $C_3H_8$ gas, and the $H_2$ gas are set to be, for example, 10 to 600 sccm, 10 to 600 sccm, and 10 to 150 slm, respectively, and the temperature of the substrate holder 15 is set to be, for example, 1,600 degrees C. to 1,700 degrees C. More specifically, the flow rates of the $SiH_4$ gas and the $C_3H_8$ gas are adjusted such that the C/Si ratio becomes 0.5, for example, for the first few minutes, and subsequently, the flow rate of the $C_3H_8$ gas is increased such that the C/Si ratio becomes 0.8. After the flow rate of the $C_3H_8$ gas is increased, it is possible to form the SiC film having a desired film thickness on the surface of the substrate holder 15 by maintaining the $SiH_4$ gas and the $C_3H_8$ gas for, for example, thirty minutes.

In the SiC film coating process, as described above, the C/Si ratio at the start of the SiC film formation is set to be as low as 0.5 or the like, whereby it is possible to enhance the adhesion of the graphite of the substrate holder 15 and the SiC film formed in the coating process.

In addition, in the SiC film coating process, the SiC film may be formed on the SiC film as the protective film of the substrate holder 15 under the same condition as that in the film formation. In this case, for example, after maintaining the flow rates of the $SiH_4$ gas and the $C_3H_8$ gas for thirty minutes in a state in which the C/Si ratio becomes 0.8 as described above, the flow rate of propane is increased such that the C/Si ratio becomes 1.2 to 1.4, and a dopant gas is caused to flow at a predetermined flow rate and is maintained at such a state for a predetermined time (e.g., thirty minutes). By forming the SiC film on the SiC film as the protective film of the substrate holder 15 under the same condition as in the film formation, it is possible to prevent the SiC film formed on the substrate holder 15 from affecting the film formation after the cleaning process.

In this example, the substrate W is directly placed on the stage 15a. However, loading and unloading of the substrate W may be performed in units of a flat plate holder capable of holding a plurality of substrates W, and the holder may be placed on the stage 15a. In this case, during the SiC film coating process, a holder that is maintained by polishing and does not hold a substrate W may be placed on the stage 15a. In this case, the housing structure of the substrate holder 15 and the holder may be simultaneously coated with the SiC film.

In the above description, nothing is placed on the stage 15a during the cleaning process. However, in order to prevent the surface of the stage 15a from being damaged by the cleaning process, a cleaning holder or substrate may be placed on the stage 15a during the cleaning process so as to protect the stage 15a.

In the above description, the $ClF_3$ gas is used to remove unnecessary reaction products attached during the film formation, but other fluorine-based cleaning gases such as a ClF gas and a $ClF_5$ gas may also be used.

In the above example, the source gas supplied to the substrate W is supplied and discharged in the direction parallel to the substrate W. However, the cleaning method of the present embodiment may also be applied to a film-forming device in which the source gas is supplied from a direction perpendicular to the substrate W.

EXAMPLE

A SiC substrate W, on which a SiC film is formed after the cleaning method of the first embodiment is performed on the film-forming device 1 of FIG. 3, was taken as Example. In the cleaning method concerning Example, after the reaction product removal process using the $ClF_3$ gas, a residual substance removal process was performed by introducing the air under a condition in which a flow rate of the air was set to be 7 slm, a pressure in the processing container 11 was set to be 70 kPa, and a temperature of the substrate holder 15 was set to be room temperature.

A SiC substrate W, on which a SiC film is formed after performing, on the film-forming device 1 of FIG. 4, a cleaning method including all the processes included in the cleaning method of the present embodiment other than the residual substance removal process using introduction of the air, was taken as Comparative Example 1.

A SiC substrate W, on which a SiC film is formed after performing, on the film-forming device 1 of FIG. 4, a cleaning method including the following Ar gas introduction process, was taken as Comparative Example 2. The cleaning method concerning Comparative Example 2 includes a process of introducing an Ar gas into the processing container 11 in place of the residual substance removal process using introduction of the air in the cleaning method according to the first embodiment, and the processes other than the Ar gas introduction process are the same as those of the cleaning method according to the first embodiment. In the cleaning method concerning Comparative Example 2, after the reaction product removal process using the $ClF_3$ gas, the Ar gas introduction process was performed under a condition in which a flow rate of the air was set to be 7 slm, a pressure in the processing container 11 was set to be 70 kPa, and a temperature of the substrate holder 15 was set to be 550 degrees C.

In the Example and Comparative Examples 1 and 2, thicknesses of the SiC films formed on the SiC substrates W were set to be 7 μm. In the cleaning methods concerning the Example and Comparative examples 1 and 2, the reaction product removal process using the $ClF_3$ gas was performed under a condition in which the flow rate of the Ar gas was set to be 13 slm, the pressure in the processing container 11 was set to be 5 kPa, and the temperature of the substrate holder 15 was set to be 550 degrees C.

FIG. 7 is a view illustrating impurity concentration distributions in the depth direction in the Example and Comparative Example 1, wherein boron concentrations are illustrated.

As illustrated in FIG. 7, the Example shows a very low boron concentration compared to Comparative Example 1, and satisfies a reference level (0.01 ppm or less) for use in a device.

Figure 8A:
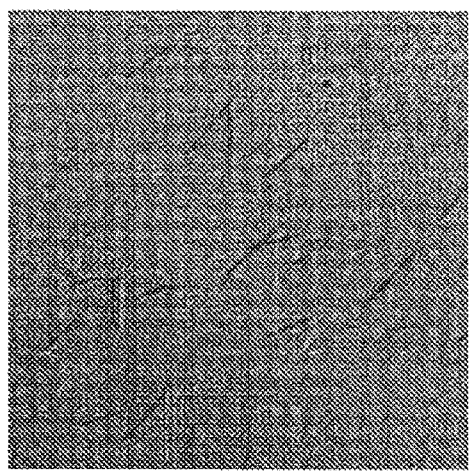
FIGS. 8A and 8B are views illustrating results obtained by imaging surfaces in Example and Comparative Example 2 using an optical microscope, wherein the results show distributions of defects in Example and Comparative Example 2.
Figure 8B:
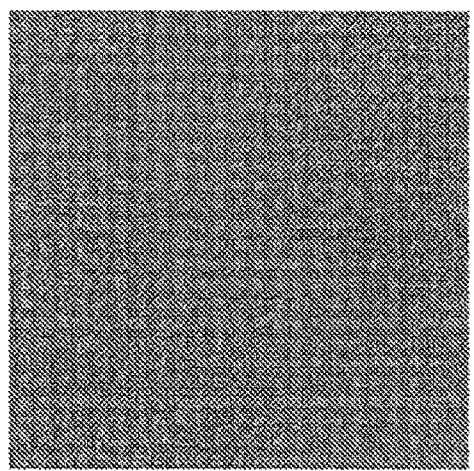
Figure 9A:
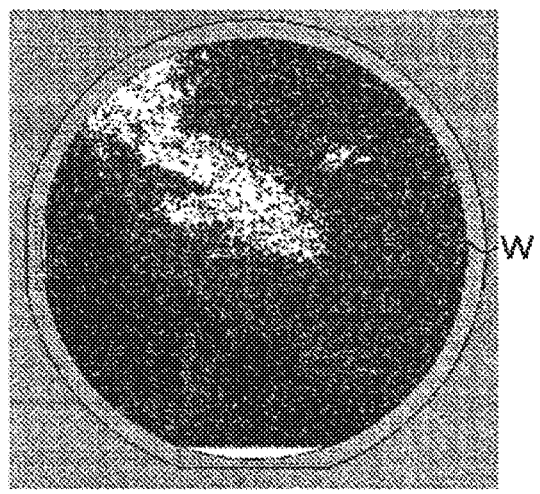
FIGS. 9A and 9B are views illustrating surface defect maps in Example and Comparative Example 2.
Figure 9B:
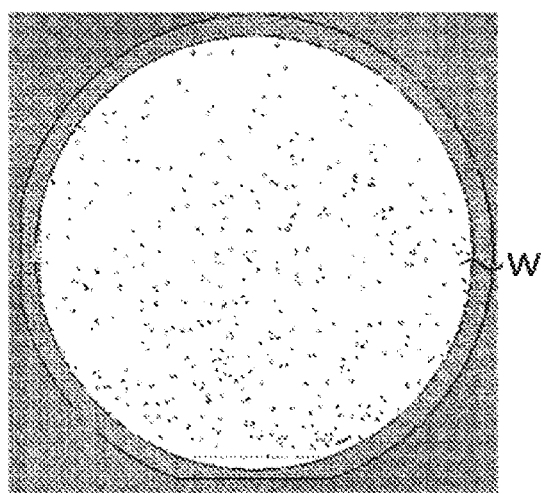

FIGS. 8A and 8B are views illustrating results obtained by imaging surfaces in the Example and Comparative Example 2 using an optical microscope, and FIGS. 9A and 9B are views illustrating distributions of defects in the Example and Comparative Example 2.

As illustrated in FIGS. 8A and 9A, in Comparative Example 2, triangular defects were observed over the entirety of the SiC substrate W.

In contrast, in Example, almost no triangular defects were observed as illustrated in FIGS. 8B and 9B.

(Consideration of Effects of Residual Substance Removal Process Using Introduction of Air)

As is clear from FIGS. 7 to 9B, as in the cleaning method of the first embodiment, by performing the residual substance removal process using introduction of the air after the reaction product removal process using the $ClF_3$ gas, it is possible to greatly reduce the amount of unnecessary impurities and defects in the SiC film formed after a series of the cleaning processes. In the following, effects of the residual substance removal process using introduction of the air will be considered.

Fourier transform infrared spectroscopy (FTIR) analysis was performed on a gas, which was exhausted from the vacuum pump 12b when the air was introduced into the processing container 11 after the removal of reaction products using the $ClF_3$ gas. In the FTIR analysis, the air was introduced into the processing container 11 while controlling the flow rate of the air to be 7 slm, the pressure in the processing container 11 to be 65 kPa, and the temperature of the housing structure 15b to be room temperature. Further, after the introduction of the air was stopped, the APC valve of the pressure adjustor 12c was opened, and thereafter, an Ar gas was intermittently introduced into the processing container 11 at a predetermined flow rate.

For comparison, the FTIR analysis was also performed on a gas, which was exhausted from the vacuum pump 12b when an Ar gas was introduced into the processing container 11 after the removal of the reaction products using the $ClF_3$ gas. In this FTIR analysis, the Ar gas was supplied into the processing container 11 while controlling the flow rate of the Ar gas to be 7 slm, the pressure in the processing container 11 to be 72 kPa, and the temperature of the housing structure 15b to be 550 degrees C.

According to the former FTIR analysis, when the air, that is, a gas containing moisture, is introduced into the processing container 11, a $SiF_4$ gas is rapidly increased immediately after the introduction, and when the pressure in the processing container 11 increases, a HF gas is formed. During the introduction of the air, the amounts of the $SiF_4$ gas and the HF gas are gradually decreased. Further, when the Ar gas is supplied into the processing container 11 after the introduction of the air, the $SiF_4$ gas is increased immediately after the start of supply, but the amount of the HF gas is decreased regardless of whether or not the Ar gas is supplied.

In addition, according to the latter FTIR analysis for comparison, when the Ar gas, that is, a gas containing no moisture, is introduced instead of the air immediately after the cleaning process using the $ClF_3$ gas, the $SiF_4$ gas is rapidly increased immediately after the introduction. However, the HF gas is not formed even when the pressure in the processing container 11 is increased.

From these results, the following is presumed. That is, it is considered that, when removing the reaction products using the $ClF_3$ gas, an unstable fluorine compound formed by reaction of Si or carbon (C) with fluorine remains in the processing container 11, and this fluorine compound becomes a causative substance that adversely affects the subsequent film formation. However, it is presumed that this fluorine compound reacts with the moisture in the air and is discharged as the HF gas, which makes the fluorine compound harmless and prevents the occurrence of defects during the subsequent film formation.

$C_XF_Y$ as an example of the fluorine compound in the processing container 11 is considered to react with moisture in the air, for example, according to the following reaction formula and to be discharged as a HF gas.

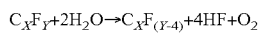

$$C_XF_Y + 2H_2O \rightarrow C_XF_{(Y-4)} + 4HF + O_2$$

Reference Embodiment

When the amount of the $ClF_3$ gas is small in the unnecessary reaction product removal process, only the above-described hydrogen annealing process may be performed without performing the residual substance removal process by introducing atmospheric gas.

Although the embodiments of the present disclosure have been described above with reference to the accompanying drawings, the present disclosure is not limited to such examples. It will be apparent to those ordinarily skilled in the art that various modifications or changes can be conceived within the scope of the technical idea described in the claims, and it will be understood that the modifications or changes naturally fall within the technical scope of the present disclosure.

INDUSTRIAL APPLICABILITY

The present disclosure is useful for a technique for forming a SiC film through epitaxial growth.

EXPLANATION OF REFERENTIAL NUMERALS

1: film-forming device, 11: processing container, 12: exhaust line, 12a: exhaust pipe, 12b: vacuum pump, 12c: pressure adjustor, 13: pressure gauge, 14: coil, 14a: high-frequency power supply, 15: substrate holder, 15a: stage, 15b: housing structure, 16: insulation material, 17: gas supply line, 18: air introduction line, 18b: air introduction port, 18c: mass flow controller, 18d: valve, 100: controller

What is claimed is:

1. A cleaning method of cleaning a film-forming device, which includes a processing container having a substrate holder provided in the processing container so as to hold a substrate to be processed, and which supplies a source gas to the processing container, an interior of which is depressurized, and heats the substrate to be processed so as to perform a film formation on the substrate to be processed, the cleaning method comprising:
a reaction product removal process of removing a reaction product, which is formed during the film formation and attached to portions other than the substrate to be processed, by supplying a fluorine-based cleaning gas into the processing container after the film formation;
a residue removal process of removing a substance, which remains after the reaction product removal process and serves as an unnecessary impurity or causes a defect during a subsequent film formation, by supplying air into the processing container;
an additional removal process of removing the substance, which remains after the reaction product removal process and is not removed by the residue removal process, by supplying a hydrogen gas into the processing container; and
subsequently to the additional removal process, a protective film formation process of forming a protective film on a surface of the substrate holder by supplying the source gas to the processing container,
wherein in the reaction product removal process, the substrate holder is selectively heated by induction heating by a coil connected to a high-frequency power supply provided outside the processing container,
wherein in the additional removal process, a temperature of the substrate holder is set to be 1,500 degrees C. or higher, and
wherein in the protective film formation process, a temperature of the substrate holder is set to be 1,600 degrees C. to 1,700 degrees C.

2. The cleaning method of claim 1, wherein in the reaction product removal process, a temperature of the substrate holder is set to be lower than a temperature of the substrate holder during the film formation, and ranges from 400 degrees C. to 600 degrees C.

3. The cleaning method of claim 1, wherein the film-forming device performs a SiC film formation on the substrate to be processed,
wherein in the protective film formation process, a $SiH_4$ gas and a $C_3H_8$ gas are supplied as the source gas, and a SiC film is formed as the protective film, and
wherein a C/Si ratio of the source gas increases during the protective film formation process.

4. The cleaning method of claim 1, wherein, before the protective film formation process, the surface of the substrate holder contains graphite, and
wherein the protective film formation process includes a process of maintaining a C/Si ratio of the source gas at 0.5 and subsequently a process of maintaining the C/Si ratio of the source gas at 0.8.

5. The cleaning method of claim 1, wherein, before the protective film formation process, the surface of the substrate holder contains SiC, and wherein the protective film formation process includes a process of maintaining a C/Si ratio of the source gas at 0.8 and subsequently a process of maintaining the C/Si ratio of the source gas at 1.2 to 1.4.

* * * * *